United States Patent
Touzov

(10) Patent No.: US 7,310,232 B2
(45) Date of Patent: Dec. 18, 2007

(54) MULTI-SURFACE HEAT SINK FILM

(76) Inventor: Igor Victorovich Touzov, 311 Castle Hayne Dr., Cary, NC (US) 27519

(*) Notice: Subject to any disclaimer, the term of this patent is extended or adjusted under 35 U.S.C. 154(b) by 61 days.

(21) Appl. No.: 11/307,865

(22) Filed: Feb. 26, 2006

(65) Prior Publication Data

US 2007/0153481 A1 Jul. 5, 2007

Related U.S. Application Data

(63) Continuation-in-part of application No. 11/307,359, filed on Feb. 2, 2006, and a continuation-in-part of application No. 11/307,292, filed on Jan. 31, 2006, and a continuation-in-part of application No. 11/307,125, filed on Jan. 24, 2006, and a continuation-in-part of application No. 11/307,051, filed on Jan. 20, 2006, and a continuation-in-part of application No. 11/306,531, filed on Dec. 30, 2005, and a continuation-in-part of application No. 11/306,530, filed on Dec. 30, 2005, and a continuation-in-part of application No. 11/306,529, filed on Dec. 30, 2005, and a continuation-in-part of application No. 11/306,527, filed on Dec. 30, 2005.

(51) Int. Cl.
*H05K 7/20* (2006.01)

(52) U.S. Cl. ............ 361/701; 361/699; 361/700; 361/719; 165/80.4; 165/104.14; 165/104.26; 174/15.1; 174/16.1; 174/16.3

(58) Field of Classification Search ........ 361/687, 361/704–719, 698–702; 257/715, 718, 714, 257/722; 165/80.3, 80.4, 104.21, 104.26, 165/104.33, 46, 185; 174/15.1, 15.2, 163
See application file for complete search history.

(56) References Cited

U.S. PATENT DOCUMENTS

| | | | |
|---|---|---|---|
| 3,971,435 A * | 7/1976 | Peck | 165/78 |
| 4,971,144 A * | 11/1990 | Gibson et al. | 165/170 |
| 4,999,741 A * | 3/1991 | Tyler | 361/705 |
| 5,166,864 A * | 11/1992 | Chitwood et al. | 361/720 |
| 5,315,480 A * | 5/1994 | Samarov et al. | 361/705 |
| 5,403,973 A * | 4/1995 | Santilli et al. | 174/15.1 |
| 5,560,423 A * | 10/1996 | Larson et al. | 165/104.26 |
| 5,642,775 A * | 7/1997 | Akachi | 165/104.14 |
| 5,642,776 A * | 7/1997 | Meyer et al. | 165/104.26 |
| 5,671,120 A * | 9/1997 | Kikinisi | 361/687 |
| 5,829,512 A * | 11/1998 | August | 165/46 |
| 6,212,074 B1 | 4/2001 | Gonsalves et al. | |
| 6,446,706 B1 * | 9/2002 | Rosenfeld et al. | 165/46 |
| 6,626,233 B1 | 9/2003 | Connors | |
| 6,667,885 B2 | 12/2003 | Malone et al. | |
| 6,914,780 B1 | 7/2005 | Shanker et al. | |
| 6,966,361 B2 | 11/2005 | Connors | |
| 7,066,240 B2 * | 6/2006 | Dussinger et al. | 165/104.26 |

FOREIGN PATENT DOCUMENTS

| | | | |
|---|---|---|---|
| JP | 408086578 A | * | 4/1996 |
| JP | 02003322483 A | * | 11/2003 |

\* cited by examiner

*Primary Examiner*—Michael Datskovskiy

(57) ABSTRACT

An electrical assembly comprising plurality of heat producing devices in direct thermal contact with perforated heat pipe film. Direct benefits of this invention for circuit board packages are weight reduction, volume reduction, increase of allowable heat dissipation.

19 Claims, 3 Drawing Sheets

MULTI-SURFACE HEAT SINK FILM

RELATED APPLICATIONS

This application is a continuation-in-part of each of:
(1) U.S. patent application Ser. No. 11/307,359, filed Feb. 2, 2006, entitled "Stretchable and transformable planar heat pipe for apparel and footwear, and production method thereof", hereby incorporated by reference
(2) U.S. patent application Ser. No. 11/307,292, filed Jan. 31, 2006, entitled "High throughput technology for heat pipe production", hereby incorporated by reference
(3) U.S. patent application Ser. No. 11/307,125, filed Jan. 24, 2006, entitled "Integral fastener heat pipe", hereby incorporated by reference
(4) U.S. patent application Ser. No. 11/307,051, filed Jan. 20, 2006, entitled "Process of manufacturing of spongy heat pipes", hereby incorporated by reference
(5) U.S. patent application Ser. No. 11/306,531, filed Dec. 30, 2005, entitled "High flux density thermal interface", hereby incorporated by reference
(6) U.S. patent application Ser. No. 11/306,530, filed Dec. 30, 2005, entitled "Heat pipes utilizing load bearing wicks", hereby incorporated by reference
(7) U.S. patent application Ser. No. 11/306,529, filed Dec. 30, 2005, entitled "Perforated heat pipes", hereby incorporated by reference
(8) U.S. patent application Ser. No. 11/306,527, filed Dec. 30, 2005, entitled "Heat pipes with self assembled compositions", hereby incorporated by reference

FIELD OF THE INVENTION

Present invention relates to heat dissipating devices in circuit boards with multilevel surfaces.

BACKGROUND OF THE INVENTION

Heat dissipation in electronic devices is important and broadly publicized topic. There are wealth of published patents and technical documents attempting to improve engineering solutions in this area. Most popular technologies utilize metal heat sinks, cold plates, and thermally conductive fillers.

Number of heat sinks on typical board is close to ten, which makes it assembly and handling less convenient. In prior art Gonsalves, et al. (U.S. Pat. No. 6,212,074) attempt to solve this challenge by using planar heat dissipating surface and thermally conductive filler to couple plurality of multilevel surfaces to this sink. In another invention Connors (U.S. Pat. No. 6,626,233) suggests two-level heat sink to solve similar challenge on smaller scale.

All known technologies rely on metal heat sinks with passive of forced air to dissipate collected heat.

SUMMARY OF THE INVENTION

Interestingly enough, prior art published engineering solutions fail to utilize the fact that high thermal conductivity of good thermal conductors is only necessary in segments with high heat flux density. Prior art heat radiating/sinking devices utilize plurality of fins or similar features made of materials with high thermal conductivity, which traditionally are aluminum, copper, carbon etc. Such designs carry significant weight overhead due to high density of utilized materials.

Present invention discloses novel approach that uses flexible perforated or mesh-like heat pipe film as integral heat sink/radiator that absorbs heat from plurality of heat producing surfaces at various levels and angles. In trivial example these heat producing surfaces are semiconductor chips or dies distributed along circuit board.

Portions of the film exhibit fin-like or pin-like features formed by the film itself or by molded polymer profiles.

Perforation or grid pattern of the film may vary and in some areas has period correlated with distances between pins or balls of semiconductor chips. This allows the film to be positioned underneath of the chip package.

DETAILED DESCRIPTION OF THE INVENTION

Methods of production and details of structural design of perforated sheet/film heat pipes was disclosed in great details in co-pending patent applications incorporated herein by references. It has been demonstrated that referred film has significant flexibility and can be stretchable as well. Shell of the film can be executed from polymers, composites, or metal foil laminates. Phase changing refrigerant liquid disposed within the film can be selected to have vapor pressure below or above atmospheric at working temperatures of the film.

One skilled in the relevant art will recognize that the concepts disclosed herein may be applied to a wide range of liquids shell materials and are not limited to embodiments discussed below and shown in the figures. First preferred embodiment of this invention utilizes water as a refrigerant, and uses laminated aluminum foil as a shell. Second preferred embodiment utilizes decafluorobutane as a refrigerant, and uses HDPE as a shell.

Figure 1:
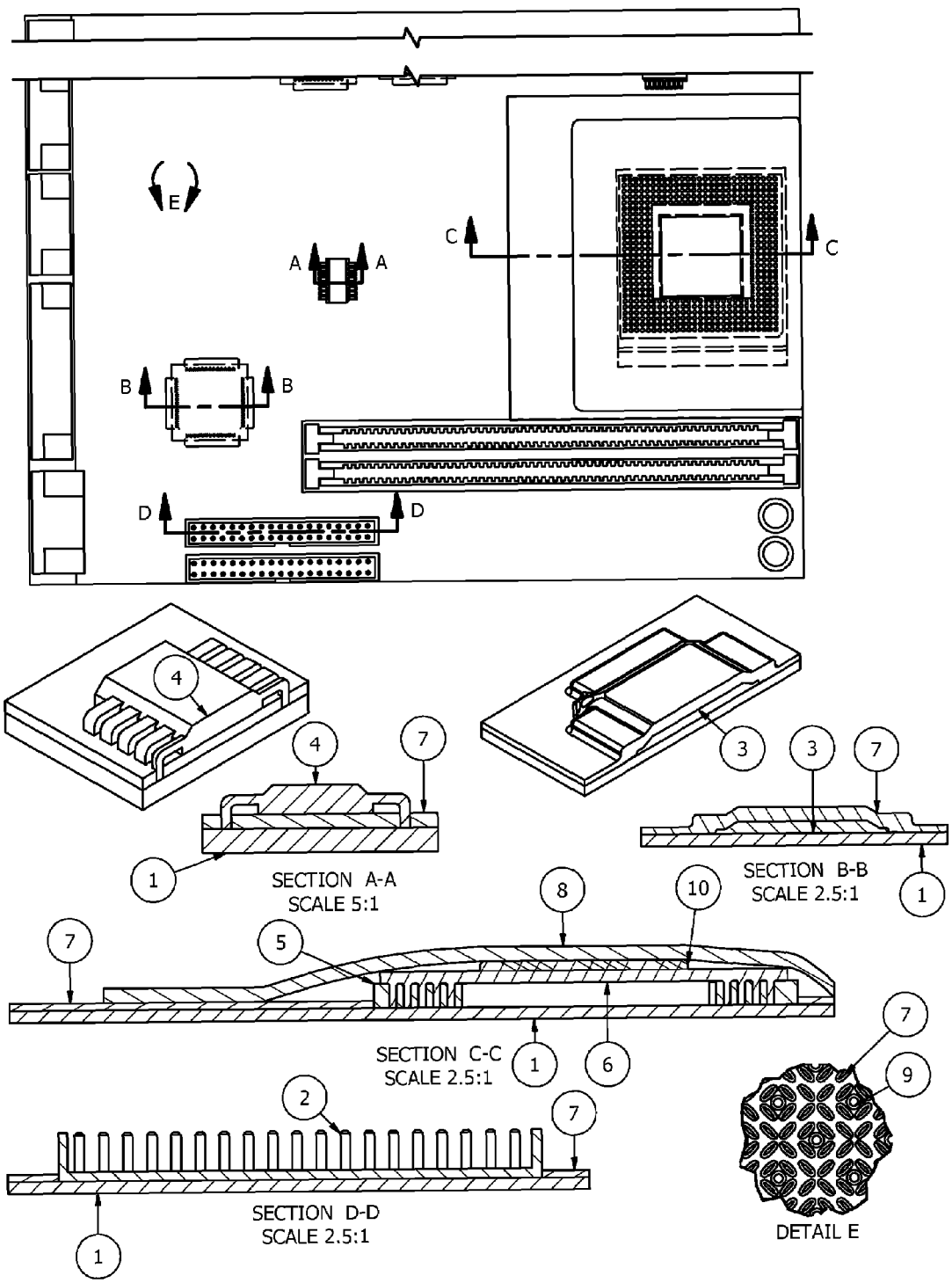
FIG. 1 First embodiment of the invention.

The film 7, as shown on FIG. 1, is disposed on surface of existing circuit board 1 that is completely or partially populated with electric components (i.e. resistors, dies, chips, other discrete elements). One surface of the film in selected scenario is coated with heat conductive adhesive or paste (not shown on the figure). In another scenario film is secured on said board by means of mechanical fasteners (omitted on the figure), wherein some of the fasteners utilize film perforations 9 to secure it on board 1.

Surface mounted components 3 are completely or partially covered (SECTION B-B) by film 7. Film 7 can be disposed along both sides of board 1 or along only one side as shown on FIG. 1.

Film 7 may contain openings 11 or cuts (SECTION C-C and SECTION D-D) that accommodate components such as passive elements 2 and 5, and active elements 6. Openings 11 can be further covered by separate segments of heat pipe film 8 that also can be executed as an integral tongue of film 7. In some cases element 8 can be substituted with plate of sheet of good thermal conductor material such as carbon fiber fabric or metal.

The film can be customized to include thermal interface pads according to 11/306,531 or other interface elements 10 like carbon sheets, metal plates, and other heat pipes located in selected places of the film, where high heat flux densities are expected. These other interface elements 10 may be pre-mounted on the board and be covered by the film.

Additional electrical components 4 can be added to the board in which case film 7 will be positioned between board 1 and the components. Because pattern 9 of perforations of film 7 correlated with periods of pins or balls of mounted component 4 it allows the component to be inserted into board 1 through the perforation openings (SECTION A-A). In this case component itself will work as a harness that sandwiches film 7 between its inner surface and board 1.

Figure 2:
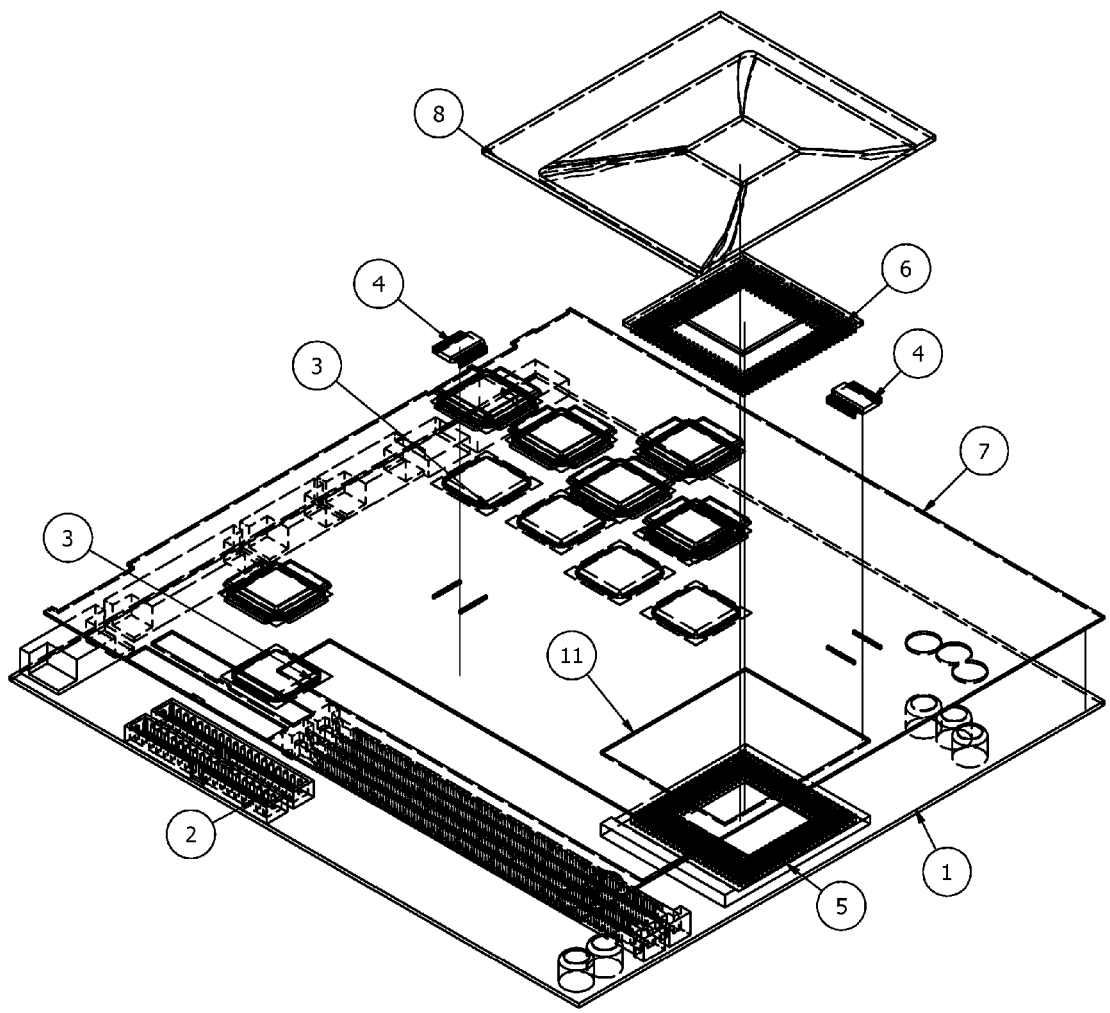
FIG. 2 Second embodiment of the invention.

FIG. 2 depictures exploited view of the assembly. Film 7 can be mounted to bend around both sides of board 1, or to cover fully or partially only one of the sides. Tongues or additional segments of the film 8 can be mounted by mechanical fasteners and harness or by adhesive. They should be disposed in thermal contact with film 7.

It must be understood that some boards may also contain special heat adsorbing devices, i.e. absorption coolers, evaporative coolers, thermoelectric coolers, etc. The film function does not change in these designs, as it continues to redistribute total amount of heat along its cover area.

Because the film is flexible and partly stretchable thermal stress does not diminish quality of heat transfer interfaces between the components and the film. Furthermore, shell composition can withstand short term overheating that can be utilized to perform soldering operations for the components 4. In another preferred embodiment aluminum laminate shell has LDPE coat that melts when mounted component is preheated brining thin aluminum foil in direct contact with the component's surface allowing for further reduction in thermal resistance of their interface.

The film diverts heat from plurality of heat sources and nearly uniformly distributes it along its total area operating as a heat spreader. Large number perforations of the film increases its total heat radiating surface area more that 100 percent. Nearly periodic pattern of the perforations creates favorable conditions for developing convection scenario resembling Rayleigh-Bénard by creating an array of vortexes alike Bénard Cells even at small (<1700) Rayleigh numbers. This effect dramatically increase passive heat loses of the film.

In presence of forced air circulation the film perforations cause turbulent flow conditions even at small air velocity. Heat loses in this scenario will obey polynomial law, which at low air velocity can be restricted by quadratic law.

One skilled in hydrodynamics or aerodynamics knows that proper adjustment of air flow velocity in such system can transform completely turbulent flow pattern into synchronized pattern of ordered vortexes. Heat loss efficiency in this model resembles bell shaped resonance curve. This allows even further increase in heat dissipation at very moderate airflow rates. The shape of the perforation openings and other surface peculiarities can be optimized to increase described effect.

The film can be adapted to nearly any shape of the board and will effectively interface with components located not only on different parallel planes but also tilted under different angles.

Figure 3:
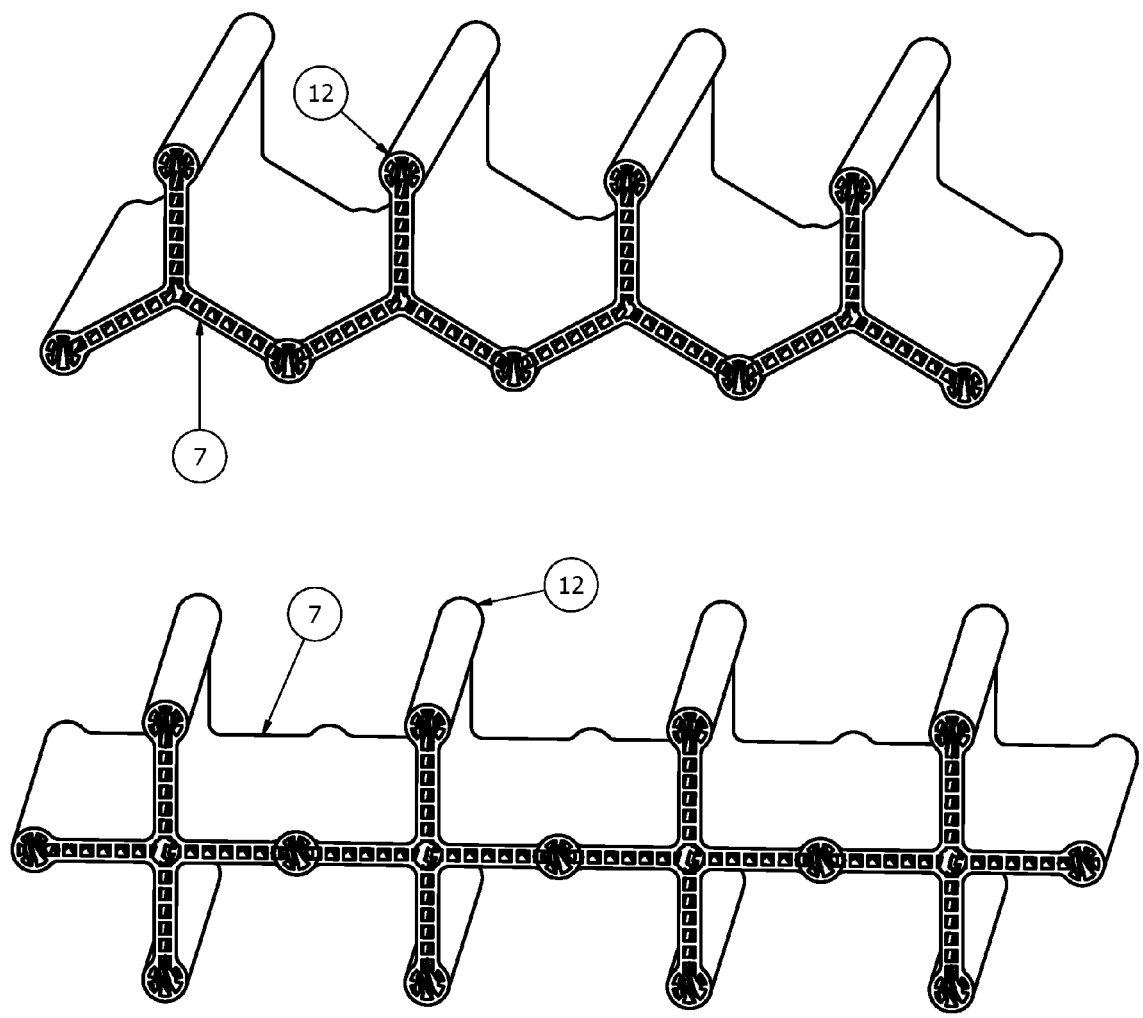
FIG. 3 An example of film's fins structure.

Because surface area of the film is large there is no need to utilize high thermal conductors to create fins of other features that increase this area. In case surface increase is still desirable the film can be laid out to form fins or pleats. FIG. 3 depictures examples of fin structures 12 formed by film 7. In addition arrays of fins, pins or other structures well known in heat sink designs can be created from moderate or poor heat conductor material (i.e. plastic, rubber) by molding or otherwise connecting them to the film surface.

Disclosed arrays of fins or pins can be disposed on both sides of film 7 (i.e. illustration on FIG. 3). In some cases these arrays create open air conduits between board 1 and film 7 that create favorable condition for natural convection. Air enters through conduits and exits through perforations 9. Opposite direction for the convection flow is equally possible. This natural convection process can be further increase by proper position of the assembly with respect to remaining fans and other forced air flow patterns of comprising assembly.

Disclosed invention can be found useful in production of circuit boards. It converts whole board surface into highly efficient heat sink. The film can be applied after board assembly is completed in a way protective overcoat is applied. The shape of the film will adapt to cover all outer surfaces of components on the board. Alternatively the film can be applied on the board prior to mounting the components. Components will then be electrically connected to the board through perforation openings of the film and thermally connected to the film by their inner surface. Perforation patterns allow for both pins and balls packages.

Direct benefits of this invention for circuit board package are weight reduction, volume reduction, increase of allowable heat dissipation.

What is claimed is:

1. An electrical assembly comprising plurality of electrical elements, optional set of heat absorbing devices, and at least one heat pipe, wherein the heat pipe embeds a vapor passages that transport vapor from higher temperature to lower temperature regions of the pipe, and said heat pipe features plurality of perforations with combined area of at least one quarter of total area of said heat pipe, wherein said perforations arranged in a pattern that practically uniform over the majority of said area, and said heat pipe has a flexibility to allow deformation that brings the surface of said heat pipe in thermal contact with more than one of said elements, and wherein surface of each of said perforations connects opposite sides of surface of said heat pipe in a way that both vapor passages and liquid passages of embedded within sealed volume of the heat pipe are preserved.

2. An assembly of claim 1 wherein some of said elements are electrically connected to common electric circuit through said perforation openings of said heat pipe.

3. An assembly of claim 2 wherein said plurality of electrical elements contains only passive elements.

4. An electrical device comprising assembly of claim 2 and plurality of active electrical components, wherein at least some of said components are in electric contact with said assembly and in thermal contact with heat pipe of said assembly.

5. An assembly of claim 1 wherein surface of said heat pipe exposes plurality of features in a pattern that correlates with pattern of said perforations, and said surface features are tuned to initiate vortex formation in adjacent air.

6. An assembly of claim 5 wherein said pattern is periodic.

7. An assembly of claim 1 wherein said perforations have pattern that correlates with orthogonal square pattern, wherein said second pattern has period equal to a period of pins or balls of standard electronic chip package.

8. An assembly of claim 1 wherein said heat pipe has plurality of pins or fins features attached to its surface.

9. An assembly of claim 8, wherein said features are made from plastic.

10. An assembly of claim 8, wherein said features are made from rubber.

11. An assembly of claim 8, wherein said features are made from composite material.

12. An assembly of claim 8, wherein some of said features are disposed between said heat pipe and circuit board of said assembly.

13. An assembly of claim 12, wherein said features form air conduits with openings.

14. An assembly of claim 1 wherein said heat pipe has plurality of pins or fins features formed by its surface.

15. An assembly of claim 14, wherein some of said features are disposed between said heat pipe and circuit board of said assembly.

16. An assembly of claim 15, wherein said features form air conduits with openings.

17. An assembly of claim 1 wherein said heat pipe has at least one perforation opening that exceeds by dimensions at least one electrical component referred therein.

18. An assembly of claim 17 wherein there is at least one heat transmitting member that disposed in thermal contacts with said electrical component and with said heat pipe at the same time.

19. An assembly of claim 1 wherein surfaces of said heat pipe have at least two segments with distinct material composition, wherein said distinction is either material composition or material thickness.

* * * * *